(12) United States Patent
Balakrishnan et al.

(10) Patent No.: US 7,106,818 B2
(45) Date of Patent: Sep. 12, 2006

(54) METHOD AND APPARATUS FOR TIMING RECOVERY BASED ON DISPERSION CHARACTERIZATION AND COMPONENTS THEREFOR

(75) Inventors: Jaiganesh Balakrishnan, Ithaca, NY (US); William A Sethares, Cotuit, MA (US); Wonzoo Chung, Ithaca, NY (US); Richard Martin, Ithaca, NY (US); C. Richard Johnson, Jr., Newfield, NY (US)

(73) Assignee: Koninkijke Philips Electronics N.V., Eindhoven (NL)

( * ) Notice: Subject to any disclaimer, the term of this patent is extended or adjusted under 35 U.S.C. 154(b) by 708 days.

(21) Appl. No.: 09/947,780

(22) Filed: Sep. 7, 2001

(65) Prior Publication Data

US 2002/0061082 A1 May 23, 2002

Related U.S. Application Data

(60) Provisional application No. 60/241,274, filed on Oct. 17, 2000.

(51) Int. Cl.
*H04L 7/00* (2006.01)
(52) U.S. Cl. ....................... 375/355; 375/346
(58) Field of Classification Search ................ 375/349, 375/343, 229, 355, 234, 346
See application file for complete search history.

(56) References Cited

U.S. PATENT DOCUMENTS 5,809,009 A * 9/1998 Matsuoka et al. .......... 370/206

OTHER PUBLICATIONS

Jablon, Neil K. "Joint Blind Equalization, Carrier Recovery, and Timing Recovery for High-Order QAM Signal Constellations", IEEE Transactions on Signal Processing, vol. 40. No. 6, Jun. 1992, pp. 1383-1398.*
"Passband Timing Recovery in an All-Digital Modem Receiver", by D. Godard, IEEE Trans. Communications, vol. 26, No. 5 (1978), pp. 517-523.
"Joint Clock Recovery and Baseband Combining for the Diversity Radio Channel", by F. Guglielmi et al., IEEE Trans. Communications, vol. 44, (1996), pp. 114-117.
"Lectures on Adaptive Parameter Estimation", by C. Richard Johnson, Jr. Cornell University, Prentice Hall 1988, Lecture 3.

* cited by examiner

*Primary Examiner*—Jean B. Corrielus
(74) *Attorney, Agent, or Firm*—Larry Liberchuk (57) ABSTRACT

The present invention provides a method for generating a timing offset signal applied to a sampling device for recovering a symbol stream from a broadcast signal by characterizing the dispersion of received signal. Preferably, the method includes steps for generating a derivative signal approximating the derivative of the symbol stream, producing a constant representative of an expected symbol stream, and multiplying the derivative signal, the constant, and a signal one of corresponding to and approximating the symbol stream to thereby generate the timing offset signal. A dispersion characterizing receiver and a digital signal processor employed therein are also described.

19 Claims, 9 Drawing Sheets

METHOD AND APPARATUS FOR TIMING RECOVERY BASED ON DISPERSION CHARACTERIZATION AND COMPONENTS THEREFOR

BACKGROUND OF THE INVENTION

1. Field of the Invention

The present invention relates to timing recovery methods and apparatuses in communication systems. More specifically, the present invention relates to methods and corresponding apparatus for timing recovery based on dispersion in the received signal. Software and components for implementing the novel methods according to the present invention are also disclosed.

The instant patent application is based on Provisional Patent Application No. 60/241,274 of Oct. 17, 2000, which application is incorporated, in its entirety, by reference.

2. Description of the Related Art

In any communication system, it is necessary to synchronize the clock at the receiver with the clock at the transmitter, a process that is commonly called synchronization or timing recovery. In other words, timing recovery is the derivation of a timing signal from the received signal. Timing recovery can be accomplished by a variety of methods, two of which are discussed below.

Recent efforts in developing digital radio/video broadcasting systems, e.g., HDTV broadcasting systems, have highlighted the problem of optimal timing recovery as a significant issue in digital receiver design. More specifically, one of the features of digital media broadcasting channels is long delay spread multipath; the traditional approach to this problem, i.e., inclusion of fractionally spaced equalizers that are insensitive to timing phase in each receiver, is impractical in consumer electronics receivers and the like.

The problem of timing recovery consists of estimation of the timing frequency and the optimal timing phase. It will be appreciated that there are many methods of attacking this problem; for instance, the standard text entitled "Communication Systems Engineering," by Proakis et al. (Prentice Hall, N.J., 1994) describes several such methods. Circuitry for carrying of several of these methods will be discussed immediately below. Conventional timing recovery techniques and methods include the Early-Late Gate method, the minimum Mean-Squared-Error (MSE) method, the Maximum-Likelihood (ML) method, and the Output Energy Maximization (OEM) method. Both the Early-Late Gate and the ML methods were developed based on the assumption that there are no channel dynamics; the validity and performance of these methods are difficult to ascertain in the presence of several additional nontrivial channels, i.e., a multipath channel. On the other hand, the MSE criterion can be extended to the case where a multipath channel is present; however, due to the nature of the MSE algorithm, either a training sequence or feedback from the decision device must be employed in any practical implementation of the MSE algorithm. Since training sequences reduce the overall system throughput, and since the feedback from a decision device may be unreliable at the synchronization stage, a non-decision-directed (blind) method would be advantageous in time recovery in the presence of a multipath channel.

The output energy maximization method, which can be performed blindly, has been analyzed by D. N. Godard and reported in his article entitled "Passband Timing Recovery in All-Digital Modem Receiver" (IEEE Trans. Communications, Vol. 26, No. 5 (May 1978)). Another blind method which has not received significant attention utilizes the technique of dispersion minimization; this method is frequently referred to as employing a Constant Modulus Algorithm. This method can be implemented without a training signal. Guglielmi et al. considered the constant modulus approach to jointly optimize the combiner weights and timing offsets of a pair of received signals from two antennas. See Guglielmi et al., "Joint Clock Recovery and Baseband Combining for the Diversity Radio Channel," IEEE Trans. Communications, Vol. 44, pp. 114–117 (Jan. 1996). However, the application of the constant modulus algorithm (or the minimization of the dispersion of the received signal) heretofore has not been applied, or even proposed, as a solution for timing phase recovery for a single antenna structure subject to substantial multipath.

It should be noted here that all of the publications mentioned above are incorporated herein by reference.

Figure 1A:
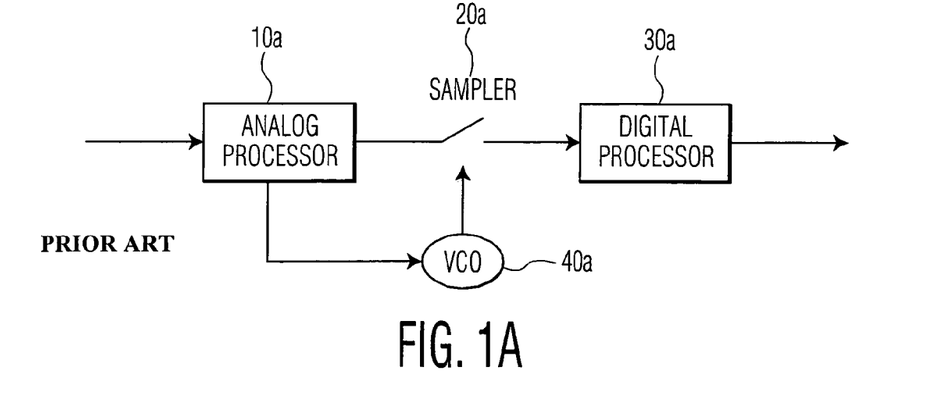
FIGS. 1A, 1B, and 1C are high-level block diagrams of circuitry which is normally employed in implementing timing recovery methods.
Figure 1B:
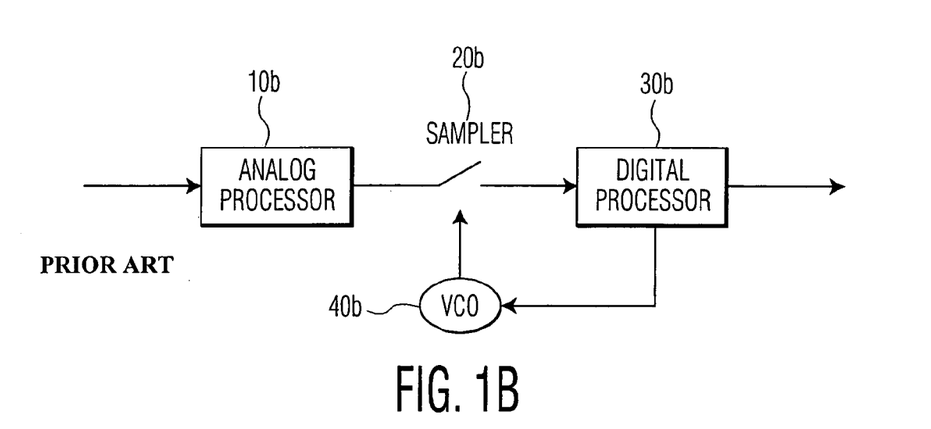
Figure 1C:
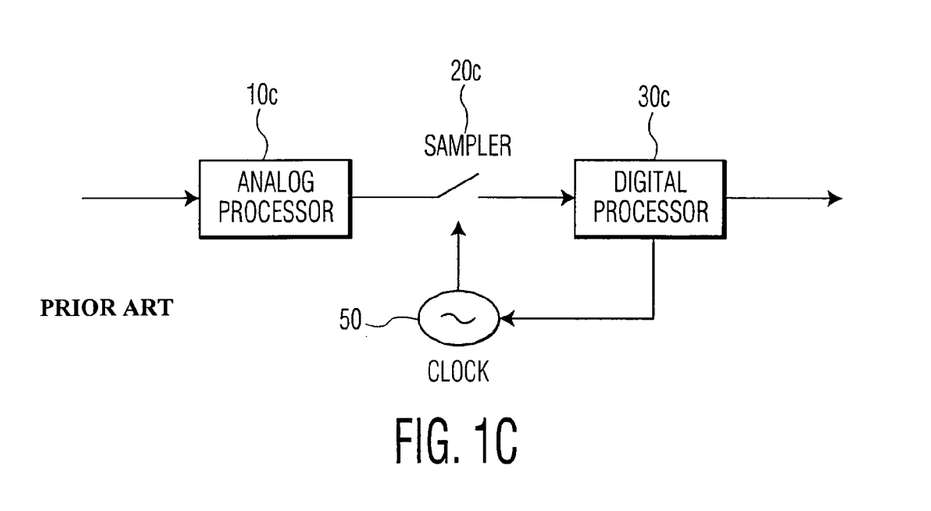

FIGS. 1A, 1B and 1C illustrate three alternative circuits which can be employed for timing recovery. The circuitry of FIG. 1A, for example, includes a signal path consisting of an analog processor 10a, a sample 20a, and a digital processor 30a. The circuit also includes a voltage controlled oscillator (VCO) 40a, which controls the sampler 20a by specifying when samples of the incoming signal are to be taken. It will be appreciated from FIG. 1A that the analog processor 10a, by controlling the rate of frequency of VCO 40a, indirectly determines when the sampling instants or events will occur. In contrast, the circuit illustrated in FIG. 1B employs the digital post processor 30b, rather that analog processor 10b, to control the rate of frequency of the VCO 40b and, hence, in determining when sampling events are to occur, i.e, when sampler 20b is to be operated. In contrast to both of the figures previously discussed, in the circuit of FIG. 1C the sampling instants at sample 20c are chosen based, not on using analog processor 10c or digital processor 30c, but rather on a free running clock 50; digital post processing is employed in recovering the values of the received signal that would have occur at the optical setting instants. None of these circuits are explicitly configured for blind timing recovery.

What is needed is a method and corresponding apparatus for timing recovery that can be performed "blindly" (without a training signal). Moreover, what is needed is a method and corresponding apparatus which can be readily implemented as either an analog procedure or in digital form. It would be advantageous if the method and corresponding apparatus were robust, e.g., insensitive to clock jitter and to the effects of intersymbol interference. What is also needed is a method which advantageously can be implemented in any of the three circuit variations illustrated in FIGS. 1A–1C.

SUMMARY OF THE INVENTION

Based on the above and foregoing, it can be appreciated that there presently exists a need in the art for timing recovery methods and corresponding apparatuses which overcome the above-described deficiencies. The present invention was motivated by a desire to overcome the drawbacks and shortcomings of the presently available technology, and thereby fulfill this need in the art.

According to a first aspect, the present invention provides a method for generating a timing offset signal applied to a sampling device for recovering a symbol stream including steps for generating a derivative signal approximating the derivative of the symbol stream, producing a constant representative of an expected symbol stream, and multiplying the derivative signal, the constant, and a signal one of corresponding to and approximating the symbol stream to thereby generate the timing offset signal.

According to another aspect, the present invention provides a method for recovering a symbol stream using a sampling device controlled by a timing offset signal by characterizing (minimizing or maximizing) the dispersion of received signal. Preferably, the method includes steps for generating a derivative signal approximating the derivative of the symbol stream, producing a constant representative of an expected symbol stream, multiplying the derivative signal, the constant, and a signal one of corresponding to and approximating the symbol stream to thereby generate a noisy timing offset signal, filtering the noisy timing offset signal to thereby generate a filtered, i.e., a substantially noise-free, timing offset signal, and applying the filtered timing offset signal to the sampling device to thereby generate the symbol stream.

According to yet another aspect, the present invention provides a receiver which extracts a digital symbol stream from a filtered signal output by a receiver filter in response to a received broadcast signal by characterizing (minimizing or maximizing) the dispersion of the received signal. Advantageously, the receiver includes a sampling device which samples the filtered signal responsive to a control signal to thereby generate the digital symbol stream, a differentiator which generates a derivative signal from a selected signal comprising one of the filtered signal and the digital signal stream, an arithmetic element which generates a constant representative of an expected symbol stream, a multiplier which generates a noisy timing offset signal responsive to the selected signal, the constant, and the derivative signal, a noise limiting device which generates the timing offset signal responsive to the noisy timing offset signal, and a voltage controlled oscillator (VCO) which generates the control signal responsive to the timing offset signal.

According to a further aspect, the present invention provides a receiver which extracts a digital symbol stream from a filtered signal output of a receiver filter in response to a received broadcast signal by characterizing (minimizing or maximizing) the dispersion of the received signal. The receiver beneficially includes a sampling device which operates at a predetermined frequency and which samples the filtered signal at the predetermined frequency to thereby generate a sampled symbol stream, a differentiator which generates a derivative value responsive to the sampled signal stream, an arithmetic element which generates a constant representative of an expected symbol stream, a multiplier which generates a noisy timing offset signal responsive to the sampled symbol stream, the constant, and the derivative value, a noise limiting device which generates the timing offset signal responsive to the noisy timing offset signal, and an interpolator responsive to the timing offset signal for interpolating the sampled symbol stream to thereby generate the digital sample stream.

According to a still further aspect, the present invention provides a receiver which extracts a digital symbol stream from a filtered signal output of a receiver filter in response to a received broadcast signal by characterizing (minimizing or maximizing) the dispersion of the received signal. The receiver preferably includes a sampling device which operates at a predetermined frequency and which samples the filtered signal at the predetermined frequency to thereby generate a sampled symbol stream, a differentiator which generates a derivative value responsive to the sampled signal stream, an arithmetic element which generates a constant representative of an expected symbol stream, a multiplier which generates a noisy timing offset signal responsive to the sampled symbol stream, the constant, and the derivative value, a noise limiting device which generates the timing offset signal responsive to the noisy timing offset signal, and a resampling circuit responsive to the timing offset signal for resampling the sampled symbol stream to thereby generate the digital sample stream.

According to yet another aspect, the present invention provides a digital signal processor which generates a control signal, which is suitable for controlling a sampler extracting a digital symbol stream from a signal produced by filtering a broadcast signal, responsive to the derivative of the signal, the signal, and a constant based on an expected symbol stream.

According to another aspect, the present invention provides a receiver which extracts a digital symbol stream from a filtered signal output by a receiver filter in response to a received broadcast signal by characterizing (minimizing or maximizing) the dispersion of the received signal. In one exemplary embodiment, the receiver includes a digital signal processor (DSP) which generates a control signal based on the derivative of the digital symbol stream, the digital symbol stream, and a constant based on an expected symbol stream, and a sampler extracting the digital symbol stream from the filtered signal responsive to the control signal.

According to a still further aspect, the present invention provides a method of determining optimum sampling times by minimizing the dispersion of the received signal. The inventive method advantageously can be implemented by any calculation aimed at minimizing (or maximizing) of the received signal for the purpose of determining optimal sampling times. Such calculations may be executed (as one of ordinary skill in the art knows) by a myriad of combinations of hardware and/or software and/or firmware, e.g., programmable digital signal processor (DSP) chips.

BRIEF DESCRIPTION OF THE DRAWINGS

These and various other features and aspects of the present invention will be readily understood with reference to the following detailed description taken in conjunction with the accompanying drawings, in which like or similar numbers are used throughout, and in which:

FIGS. 6A and 6B are curves comparing the dispersion cost surfaces produced by the inventive and MSE methods as a function of timing phase offset for $h_1=[1]$, i.e., the ideal channel, while

DESCRIPTION OF THE PREFERRED EMBODIMENTS

Illustrative embodiments and exemplary applications will now be described with reference to the accompanying drawings to disclose the advantageous teachings of the present invention. While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The inventive method and corresponding apparatus advantageously provides a techniques and structure permitting timing recovery through minimization (or maximization) of the dispersion of the received signal; any apparatus, whether harware or software, that implements such an approach to the problem of timing recovery, that is, to the problem of determining the optimal sampling times, falls within the scope of the present invention. Before discussing any of the exemplary embodiments according to the present invention, a brief discussion with respect to the concept of minimization of dispersion will be presented. In other words, the discussion which follows relates the concept of dispersion characterization with the concept of timing recovery.

One of ordinary skill in the art will appreciate that the received signal at the output of a matched filter $g_R(t)$ has the general form $$y(t) = \sum_n a_n \chi(t - nT - \tau) + v(t) \quad (1)$$

where $\chi(t)=g_T(t)*c(t)*g_R(t)$, $a_n$ is the sequence of information symbols, and v(t) is the noise. It will be appreciated that * is a convolution operator and, thus, $\chi(t)$ is the convolution of the receiver filter $g_R(t)$, the channel c(t), and the transmitter filter $g_T(t)$. It will also be appreciated that this is standard notation as used, for instance, in the text by Proakis et al. mentioned above.

The novel approach to the problem of timing recovery is based on the minimization of the dispersion of the samples, where the dispersion of the samples is defined as $$J_{disp} = E\{(y_m^2(t) - \gamma)^2\} \quad (2)$$

This advantageously can be approximated by the time average $$J_{avg} = \sum_m (y_m^2(\tau) - \gamma)^2 \quad (3)$$

Where $$y_m(\tau) = \sum_n a_n \chi(mT - nT - \tau) + v(mT) \quad (4)$$

which is written explicitly as a function of the timing offset $\tau$ and T denotes the baud rate of the received symbol stream. In equations (2) and (3), $\gamma$ denotes a constant whose value is based on the expected symbol set processed by the receiver transform function $g_R(t)$. It will be appreciated that equation (4) can be thought of a modeling of smearing, i.e., intersymbol interference (ISI).

The minimum of $J_{avg}$ with respect to the timing offset $\tau$ can be found by differentiating equation (3) with respect to $\tau$, which yields the condition $$\sum_m (y_m^2(\tau) - \gamma) y_m(\tau) \frac{dy_m(\tau)}{d\tau} = 0 \quad (5)$$

Figure 2:
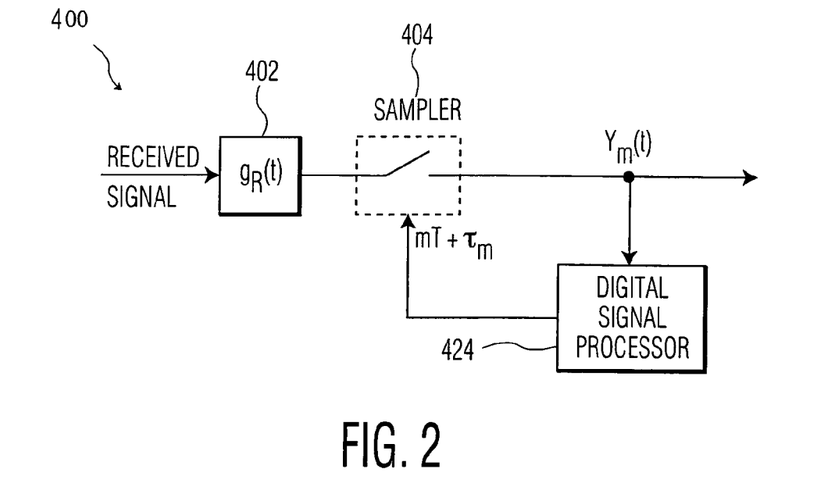
FIG. 2 is a high-level block diagram which is useful in explaining the timing recovery method according to the present invention.
Figure 3:
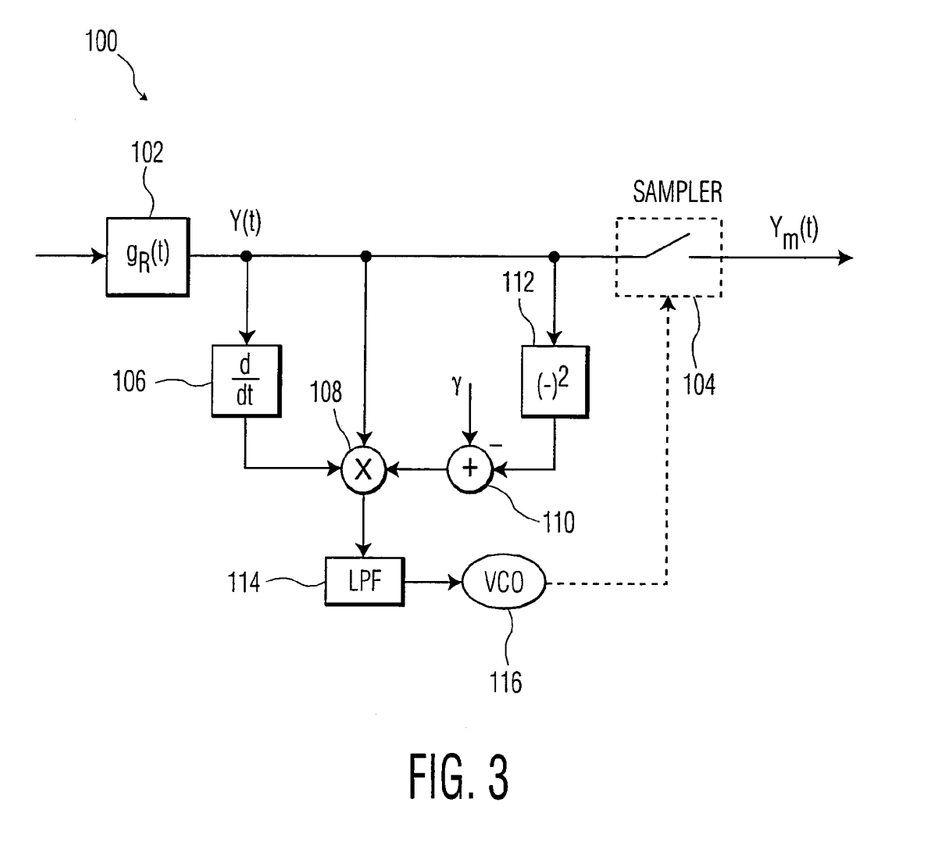
FIG. 3 is a high-level block diagram of a first circuit for timing recovery which implements the methods according to the present invention.
Figure 4:
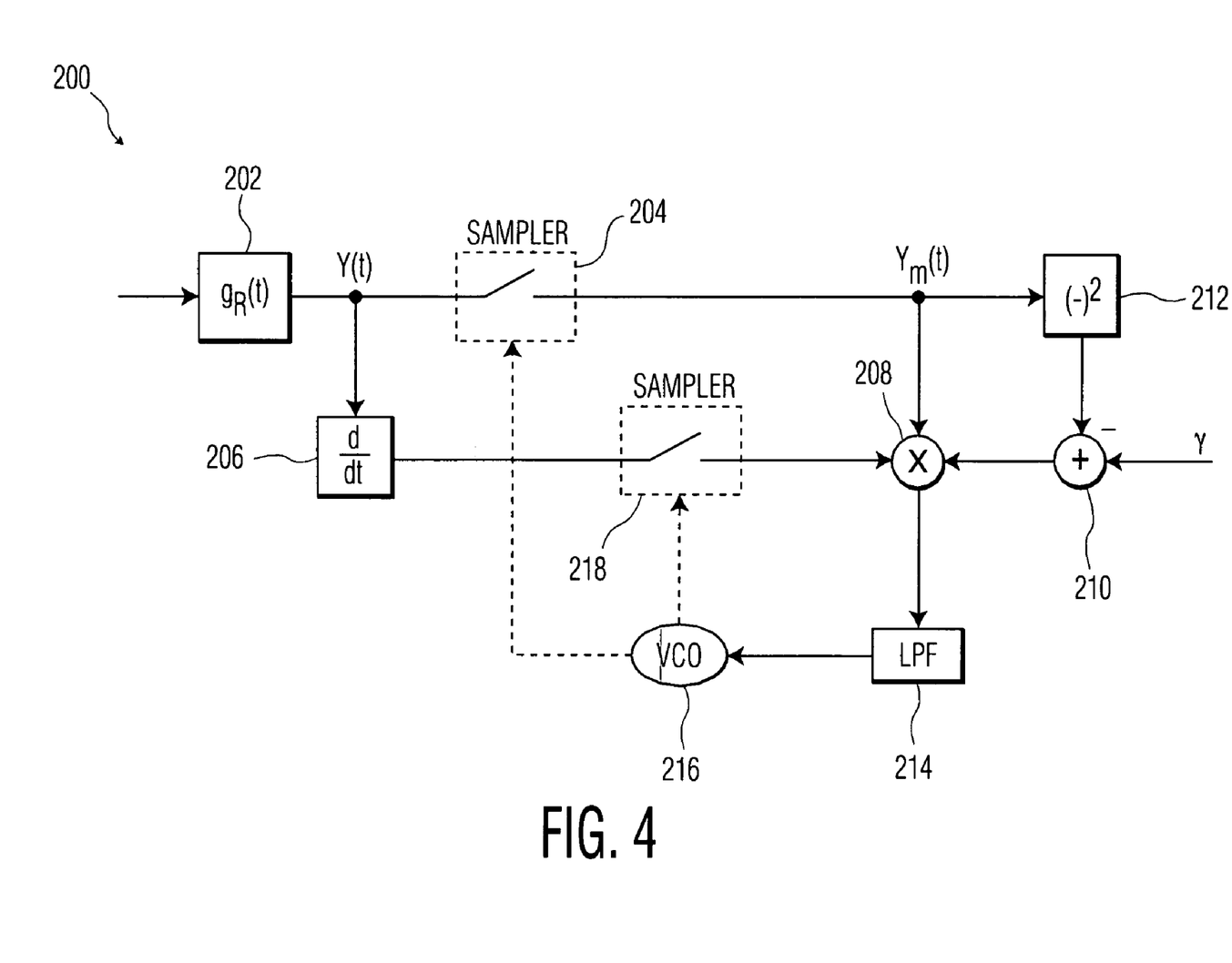
FIG. 4 is a high-level block diagram of a second circuit for timing recovery which implements the methods according to the present invention.
Figure 5:
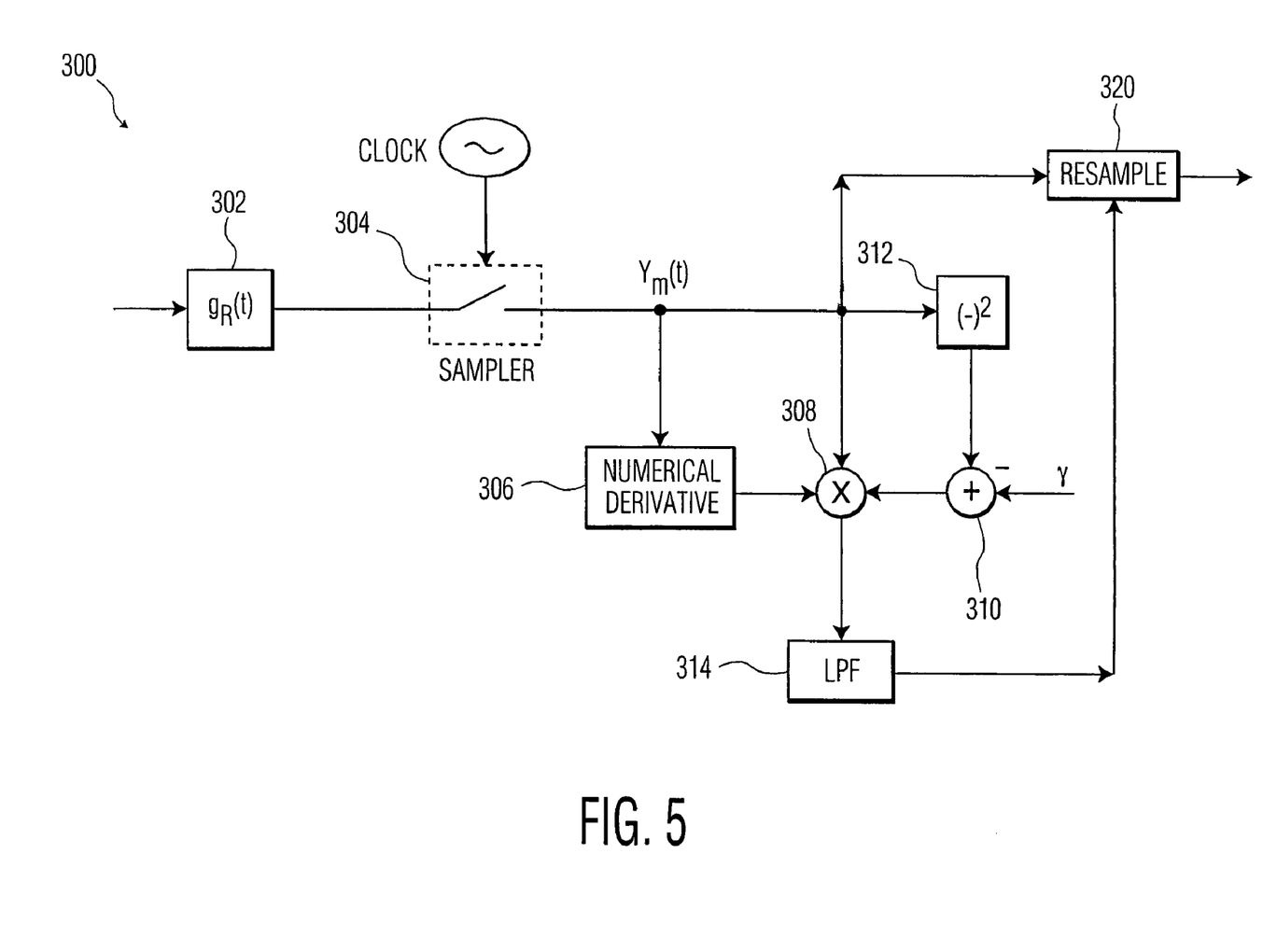
FIG. 5 is a high-level block diagram of a third circuit for timing recovery which implements the methods according to the present invention.

It should be noted that any optimal sampling time must fulfill the condition set forth in equation (5). It should also be noted that the discussion which follows provides details as to how equation (5) is translated into an implementable form. Thus, in the discussion which follows, FIG. 2 illustrates the basic form of the system needed to implement the novel timing recovery method according to the present invention while FIGS. 3–5 illustrate three specific exemplary embodiments of circuitry implementing the novel methods according to the present invention. It will be appreciated that the circuitry illustrated in FIGS. 3–5 varies depending on how much of the receiver system is to be implemented using analog hardware components and how much of the receiver system is to be implemented digitally. It should be noted that the circuits described with respect to FIGS. 3–5 correspond to the three generic structures shown illustrated in FIGS. 1A–1C, respectively.

One exemplary embodiment according to the present invention will now be described with respect to FIG. 2, which illustrates, in high-level block diagram form, a receiver 400 including a receiver filter 402, a sampler 404 downstream of the filter 402, and a digital signal processor (DSP) 424 electrically connected between the output of the sampler 404 and the control input terminal of the sampler 404. The DSP 424 advantageously receives the raw symbol stream $Y_k$ and processes it, so as to minimize the dispersion of the received signal, in the following manner, i.e., the DSP 424:

Determines the derivative, i.e., the time rate of change of the symbol stream, $Y_k$;

Squares $Y_k$ and then subtracts the generated value from a constant $\gamma$ to produce a remainder value;

Combines the original value of $Y_k$, the derivative, and remainder value to thereby generate a noisy estimate of the timing offset $\tau$; and Generates a control signal based on the noisy estimate of the timing offset $\tau$ and applies that control signal to the control terminal of the sampler 404.

It will be appreciated that the DSP 424 advantageously can filter or average the noisy estimate of the timing offset $\tau$ to thereby generate a filtered (less noisy) control signal providing a good approximation of the timing offset $\tau$ required to optimize symbol recovery at sampler 404. It will also be appreciated that a generic digital signal processor (DSP) was necessarily programmed so as to produce application specific DSP 424. One of ordinary skill in the art will immediately appreciate that software for performing the novel method discussed above can be stored in memory associated with the DSP 424.

FIG. 3 is a high-level block diagram of circuitry which advantageously can be employed in implementing a first embodiment of the timing recovery method according to the present invention. In FIG. 3, a receiver 100 includes a receiver filter 102, which implements the receiver filter function $g_R(t)$, the output of which, Y(t) is applied to various circuit elements including a sampler 104, a differentiator 106, a multiplier 108, an arithmetic element 110 and squaring element 112. Differentiator 106 receives the signal Y(t) and applies the derivative thereof to an input port of the multiplier 108, which also receives the signal Y(t) at a second input port. Preferably, the squaring element generates the signal $[Y(t)]^2$, which signal is subtracted from the constant $\gamma$ in the arithmetic element 110; the output of the arithmetic element 110 is applied to a third input port of the multiplier 108. Thus, the multiplier combines the three input signals and outputs the resultant signal, which signal corresponds to a noisy estimate of $\tau$, to the low pass filter (LPF) 114. The output of LPF 114, which corresponds to a time averaged form of the resultant signal, is applied to the control input port of the voltage-controlled oscillator (VCO) 116; the voltage controlled signal generated by VCO 116 is applied to the control port of the sampler 104, whereby the voltage controlled signal controls the times at which the sampling of the signal Y(t) occurs, producing the sampled output $Y_m(t)$.

It will be appreciated from the discussion above, the receiver 100 illustrated in FIG. 3 implements a strictly analog form of the novel time recovery method according to the present invention. A hybrid, i.e., part analog, part digital, implementation of the novel method will now be described with respect to FIG. 4, which depicts, in high level block diagram form, a receiver 200.

Receiver 200 includes a receiver filter 202, which implements the receiver filter function $g_R(t)$, the output of which, Y(t) is applied to various circuit elements including a sampler 204 and a differentiator 206, which receives the signal Y(t) and applies the derivative thereof to an input port of a sampler 218. The output of sampler 204, i.e., the signal $Y_m(t)$ is applied to both the input port of a multiplier 208 and the input port of squaring element 212. An arithmetic element 210 subtracts the output of squaring element 212 from constant $\gamma$ and applies the result to one input port of a multiplier 208. Multiplier 208, in addition to the output of the arithmetic element 210, receives the output of the samplers 204 and 218. Thus, the multiplier 208 combines the three input signals and outputs the resultant signal, which signal corresponds to a noisy estimate of $\tau$, to the low pass filter (LPF) 214. The output of LPF 214, which corresponds to a time averaged form of the resultant signal, is applied to the control input port of the voltage-controlled oscillator (VCO) 216. Advantageously, the voltage controlled signal generated by VCO 216 is applied to the control port of the sampler 204, whereby the voltage controlled signal controls the times at which the sampling of the signal Y(t) occurs, producing the sampled output $Y_m(t)$, and the sampler 218, which controls the times at which the derivative of d(Y(t))/dt is sampled.

Thus, in the receiver 200 illustrated in FIG. 4, some of the "calculations" are performed in the analog domain and some in the digital domain. However, it will also be appreciated that the inventive method according to the present invention can also be employed in receivers where symbol sampling is controlled by a free running clock, as discussed immediately below with respect to FIG. 5.

In FIG. 5, a receiver 300 according to another preferred embodiment of the present invention includes a receiver filter 302, which implements the receiver filter function $g_R(t)$, the output of which, Y(t) is applied to a sampler 304. The output of sampler 304, i.e., the signal $Y_m(t)$ is applied to the input port of a multiplier 308 and the input port of squaring element 312, and the input port of a differentiator 306, the latter receiving the stream of samples $Y_m(t)$ and applying the derivative thereof to an input port of a sampler multiplier 308. An arithmetic element 310 subtracts the output of squaring element 312 from constant $\gamma$ and applies the result to another input port of the multiplier 308. Multiplier 308, in addition to the output of the arithmetic element 310 and the differentiator 306, receives the output of the sampler 304. Again, the multiplier 308 combines the three input signals and outputs the resultant signal, which signal corresponds to a noisy estimate of $\tau$, to the low pass filter (LPF) 314. The output of LPF 314, which corresponds to a time averaged form of the resultant signal, is applied to the control input port of an interpolation circuit 320, which circuit performs resampling (or interpolation) of the sample stream Ym(t), i.e., in the digital domain, to thereby estimate the "true" value of the signal at the required timing offset $\tau$. More specifically, the output of sampler 304 is applied to a data input port of the interpolation circuit 320, while the output of the LPF 314 is applied to the control input port of circuit 320. It will be appreciated that the interpolation circuit 320 buffers the symbol stream $Y_m(t)$ to thereby permit interpolation and/or resampling of the symbol stream.

In short, for the digital timing recovery method performed by the circuitry illustrated in FIG. 5, all of the calculations are effected primarily in the digital domain. Downstream of the receiver filter 302, the signal Y(t) is sampled in sampler 304 at a rate that is strictly higher than the Nyquist rate for the expected symbol stream. The resulting samples are then processed, a (numerical) derivative is calculated, the square of each sample is determined, and the resulting squared value is arithmetically combined with the constant $\gamma$. The individual results are then multiplied to produce a raw estimate of the stream of timing offset $\tau$ values. Advantageously, the low pass filter 314 is employed to smooth these estimates (equivalently, to sum the estimates over the block of data) and then, as mentioned above, resampling (or interpolation) is performed in the digital domain to estimate the "true" value of the signal at the required timing offset $\tau$.

Stated another way, the operation of the novel timing recovery method, in all of its implementations, can best be understood by considering the instantaneous stochastic gradient descent method, i.e., the instantaneous cost or penalty function, of equation (6):

$$J_{inst} = (y_k^2(\tau) - \gamma)^2 \tag{6}$$

$$\tau_{k+1} = \tau_k - \mu(y_k^2(\tau_k) - \gamma)y_k(\tau_k)\frac{dy_k(\tau_k)}{d\tau_k} \tag{7}$$

Taking the derivative with respect to $\tau$ gives the stochastic gradient descent algorithm:

The derivative can be approximated in many ways, perhaps the simplest form being:

$$\frac{d y_k(\tau_k)}{d\tau_k} \approx \frac{y_k(\tau_k + \delta) - y_k(\tau_k - \delta)}{2\delta} \qquad (8)$$

It should be mentioned that the stepsize parameter μ advantageously can be employed as a substitute for the averaging (low pass) filter illustrated in FIGS. 3–5; a separate filter may also be used. Here, the symbol delta (δ) is a dummy variable. It will be appreciated that equation (8) is basically the differentiation or derivative of the f(y) but without express limits. Thus, δ should be set to some small fraction of the nominal timing interval T, i.e., 0.01<T<0.33.

Simulation studies were conducted to evaluate the performance of the synchronization techniques, i.e., timing recovery methods, according to the present invention. The symbols were assumed to come from a binary phase shift keying (BPSK) source constellation. The noise at the receiver was assumed to be additive white Gaussian noise (AWGN) and with a signal-to-noise (SNR) of 30 decibels (dB). A sinc pulse shaping filter was assumed as the transmit filter, $T_R(t)$. The simulations were conducted for two channels, i.e., $h_1$=[1], i.e., the ideal channel, and $h_2$=[1/√2 0–1/√2], i.e., a frequency selective channel. It will be noted that the channel $h_2$ has nulls at both the band edges and exhibits severe intersymbol interference.

Figure 6A:
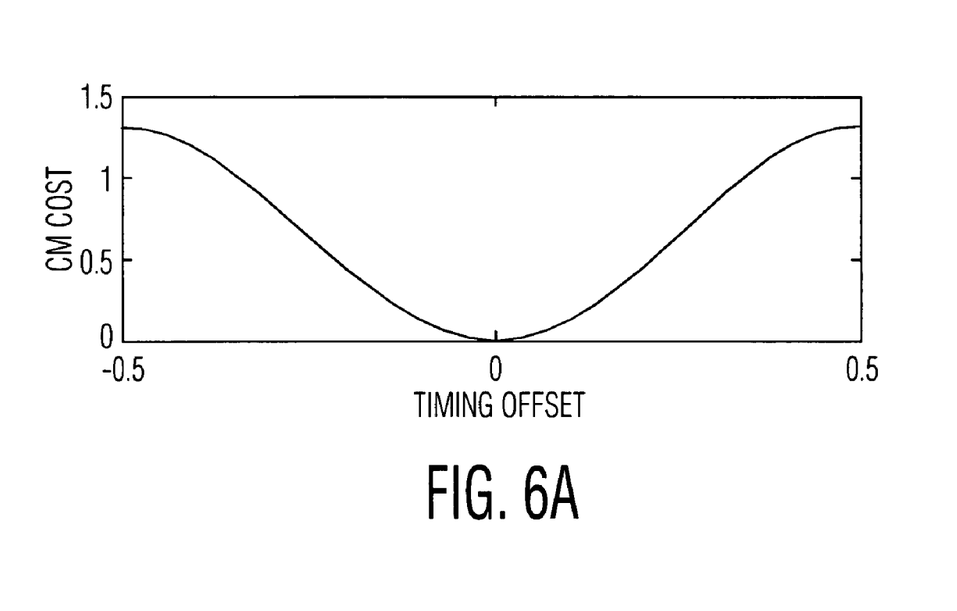
Figure 6B:
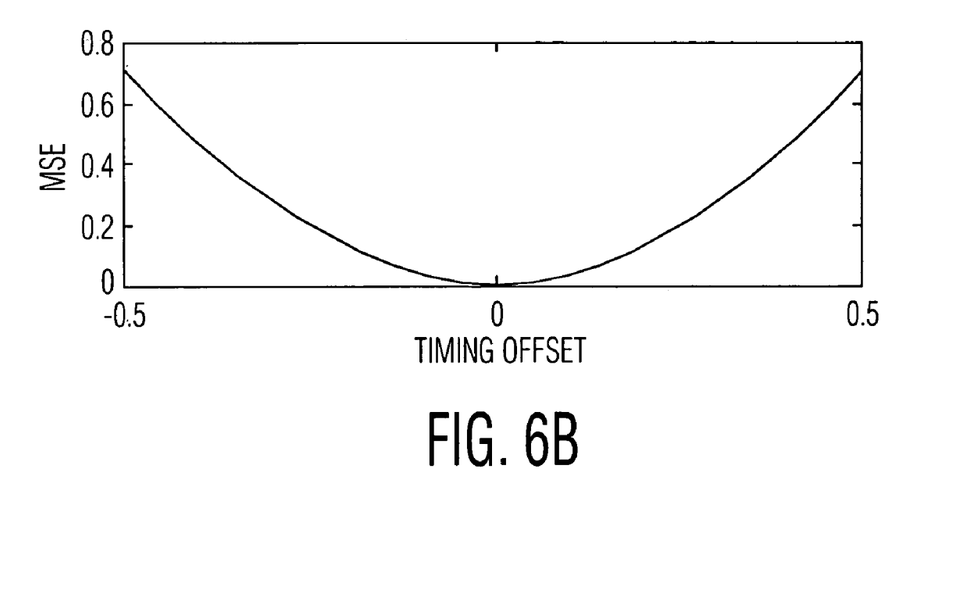
Figure 6C:
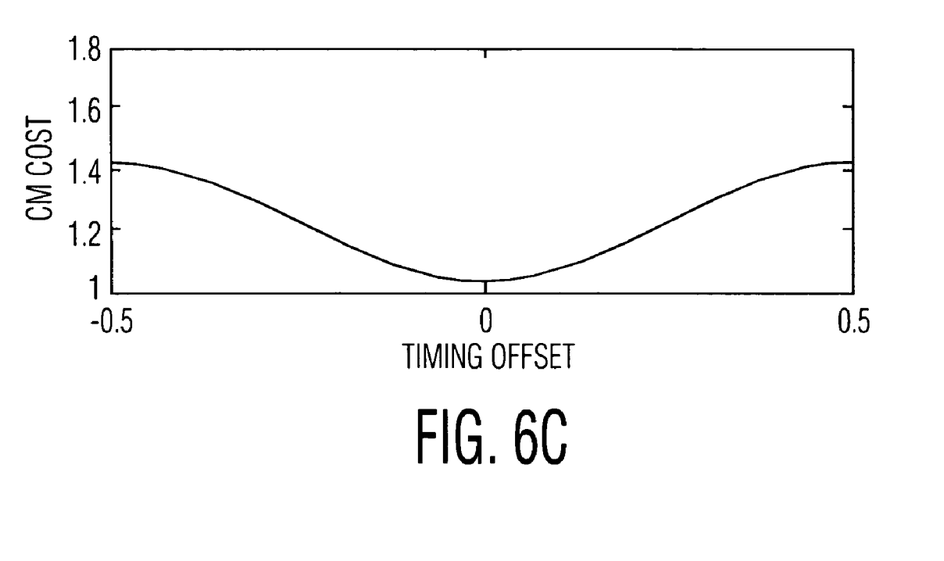
FIGS. 6C and 6D are curves comparing the dispersion cost surfaces produced by the inventive and MSE methods as a function of timing phase offset for $h_2=[1/\sqrt{2}\ 0\ -1/\sqrt{2}]$ respectively.
Figure 6D:
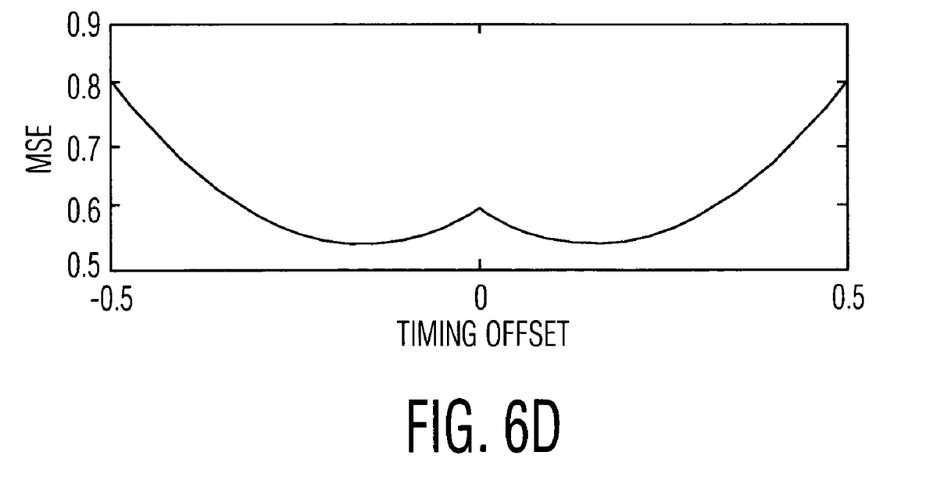

The dispersion cost surface, $J_{disp}$ as a function of the timing phase offset is illustrated in FIGS. 6A and 6C for the channels $h_1$ and $h_2$. FIGS. 6B and 6D illustrate corresponding cost surfaces $J_{MSE}$ for conventional MSE, i.e., energy minimization, timing recovery methods for channels $h_1$ and $h_2$, respectively. In each of the figures, a range of (−T/2, T/2) is considered for the timing phase offset. It should be noted that the cost surface is unimodal for the exemplary channels, which suggests that a gradient-descent algorithm designed to minimize $J_{disp}$ advantageously could be employed to track the timing phase offset τ.

As mentioned above, the dispersion cost surface $J_{disp}$ illustrated in FIGS. 6A and 6C are compared with the mean-squared-error (MSE) cost surfaces $J_{MSE}$ in FIGS. 6B and 6D, $$J_{MSE} = E\{|sgn\{\chi(\sigma T-\tau)\}y_m(\tau) - a(m-\sigma)|^2\} \qquad (9)$$

respectively. The MSE cost surface JMSE is preferably defined by the equation:
where $$\sigma = arg\max_k |\chi(kT - \tau)| \qquad (10)$$

It will be appreciated from FIGS. 6A–6D that the minimas for $J_{disp}$, and $J_{MSE}$ are quite close.

FIGS. 7A–7D collectively illustrate the performance of a stochastic gradient-descent based dispersion minimization algorithm for symbol timing recovery. It should be mentioned that the update rule applicable for this algorithm is derived from equation (7). Moreover, the transmitter clock was assumed to have an initial timing phase offset of 0.3 T and a clock frequency offset of 50 ppm. It can be readily discerned from these figures that the dispersion minimization algorithm successfully tracks the time-varying phase offset τ.

Figure 7A:
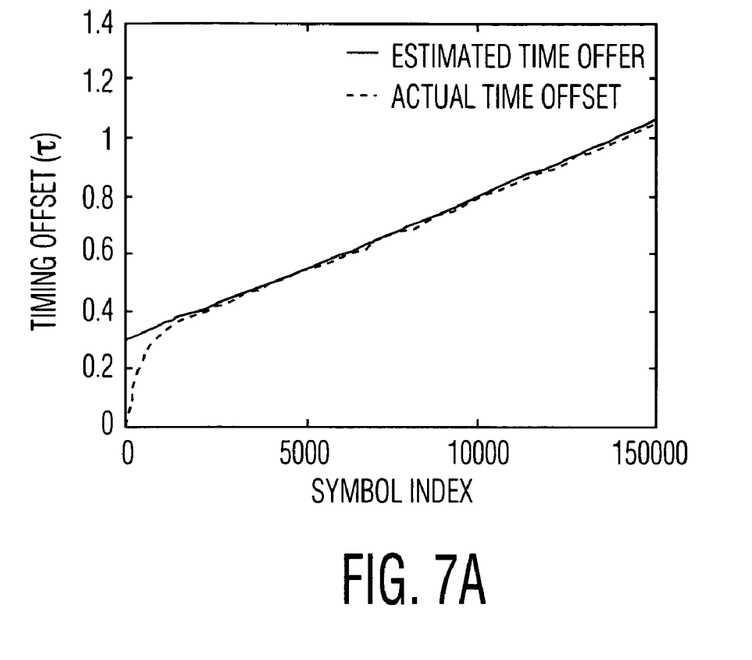
FIGS. 7A, 7B, 7C, and 7D illustrate the operation of timing synchronization using the Stochastic Gradient Descent Dispersion Minimization Algorithm (DMA) for $h_1=[1]$ (FIGS. 6A and 6C) and $h_2=[1/\sqrt{2}\ 0\ -1/\sqrt{2}]$, respectively.
Figure 7B:
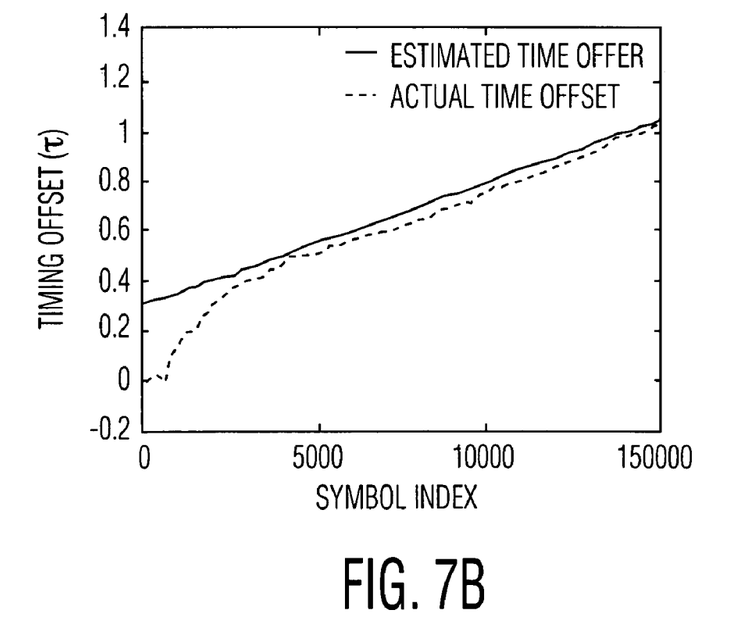
Figure 7C:
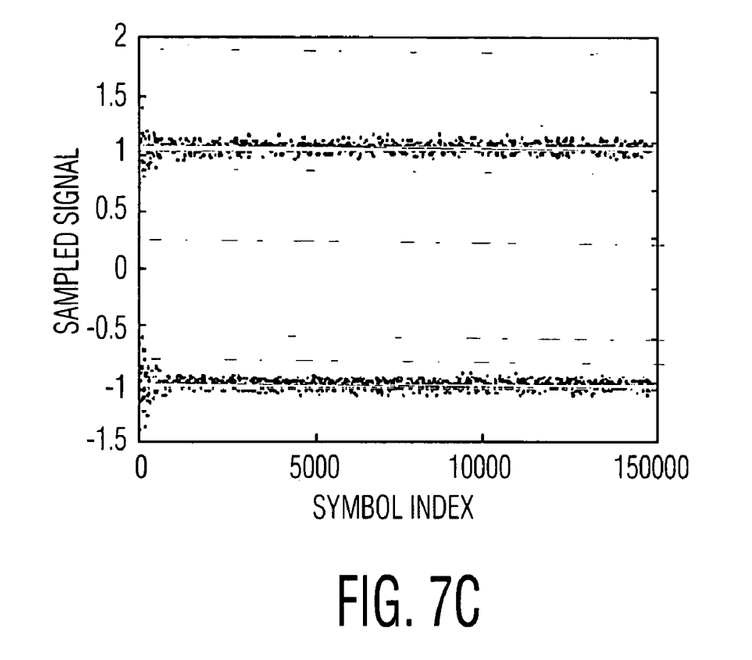
Figure 7D:
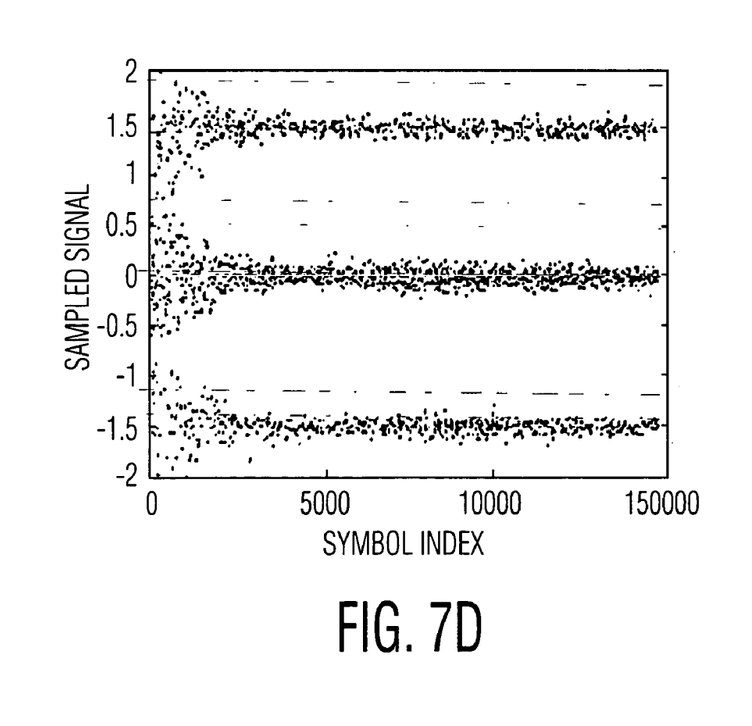

More specifically, FIGS. 7B and 7D depict scatter diagrams of the clock-synchronized sampled signal. Successful tracking of the transmitter clock results in a scatter diagram that indicates an "ISI-free," i.e., an intersymbol interference free, signal in the case of the ideal channel, $h_1$. On the other hand, in the case of the frequency selective channel, $h_2$, the scatter diagram shows three stripes, namely at $\{0, \pm(2)_{1/2}\}$ This is due to the fact that the baud-spaced digital equivalent channel corresponding to the best synchronization phase, namely the minim of the $J_{disp}$ cost surface, is [1/√2 0−1/√2].

In the discussion above, specific implementations and the theory regarding novel methods of timing recovery, based on the principles of dispersion minimization were disclosed. In particular, numerous circuit arrangements for implementing the novel methods were also disclosed. Moreover, since several of the circuit arrangements, e.g., the arrangement discussed with respect to FIG. 2, included components which necessarily are programmed so as to convert, for example, a generic digital signal processor (DSP) into an application specific DSP, one of ordinary skill in the art will immediately appreciate that software for performing the novel methods is considered to fall within the scope of the present invention. It will also be appreciated that the present invention is in no way limited to the exemplary embodiments discussed above.

In short, the novel methods and systems according to the present invention are not limited to the exemplary embodiments disclosed above; the inventive method and corresponding systems, e.g., receivers, are limited only by the claims appended hereto. Thus, the following variations, adaptions, alternatives, and modifications, which are discussed in detail below, are all considered to be within the scope of the present invention.

First, it will be appreciated that the dispersion function set forth in equation (2) can be replaced with any equation of similar form, e.g., an equation having the form:

$$J_{disp} = E\{|y_m^p(\tau) - \gamma|^q\} \qquad (11)$$

where p and q are any real numbers. In the event that the received signal is a complex, rather than a real valued, signal, the magnitude of $y_m^p$, rather that the actual value, should be employed in equation (11).

Figure 8:
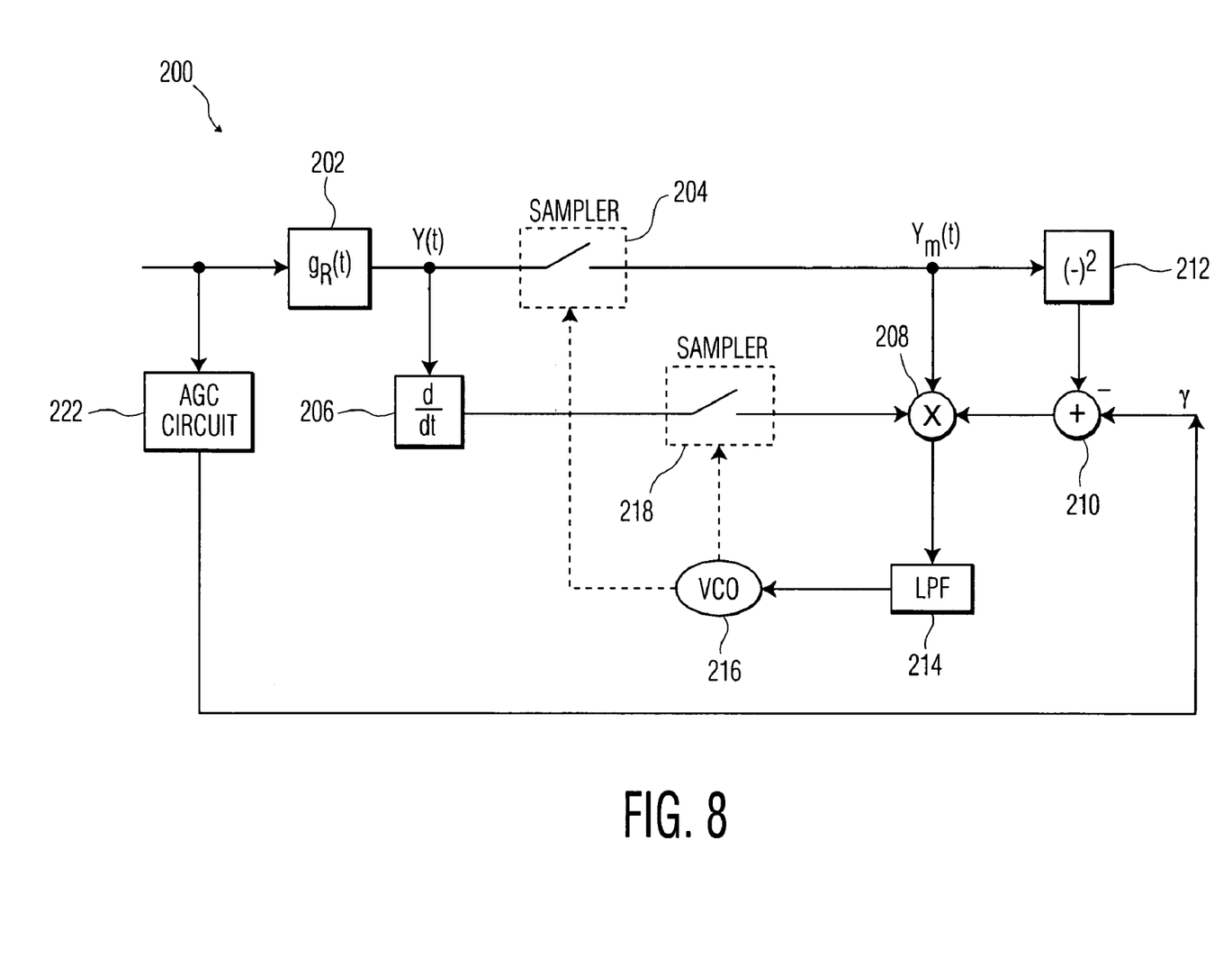
FIG. 8 is a high-level block diagram of a modified form of the second circuit for timing recovery which implements the methods according to the present invention illustrating additional circuitry permitting adaptive gamma ($\gamma$) correction.

Second, in the methods and corresponding circuitry discussed with respect to FIGS. 3–5, the "constant" γ was chosen a priori, i.e., based on the expected symbol stream applied at the receiver. However, it will be appreciated that the value of the "constant" γ advantageously can be derived dynamically. For example, as illustrated in FIG. 8, and automatic gain control (AGC) detector 222, which is electrically coupled to the input of the receiver filter 202, can be employed to generate the γ value applied to the arithmetic element 210. It will be appreciated that determining the y value based on the response to an AGC element is but one way to determine the γ value dynamically; any such suitable method for determining the "constant" γ is considered to be well within the scope of the present invention.

From the discussion immediately above, it will also be appreciated that the stepsize parameter μ, which was discussed in connection with equation (7), advantageously can be made time varying in a number of ways. For example, the algorithms for implementing the "normalized least mean squares (LMS)" method of disclosed by C. R. Johnson, Jr. in the book entitled "Lectures in Adaptive Parameter Estimation" (Prentice Hall, 1988), or the adaptive priors method described by Martin et al. In the article entitled "Exploiting Prior Knowledge in Equalization," and all other methods of adapting the stepsize are also considered to fall within the scope of the present invention. Likewise, any analog or digital method for determining and/or approximating the derivative based on the received symbol stream is also believed to be within the scope of the present invention.

Third, it will be readily appreciated that the novel methods according to the present invention, i.e., the above-identified dispersion minimization methods, advantageously can easily be combined with other methods of timing recovery, e.g., the conventional MSE method discussed above. It will be appreciated that such a hybrid method would implement the novel "blind" method of the present invention during startup and, then, switch to a decision-directed method once good symbol decisions become available.

It should be mentioned that the circuitry illustrated in FIG. 5 is but an exemplary embodiment for resampling the received symbol stream. Any appropriate method of resampling or interpolating the received symbol stream is considered to be fairly embraced by the present invention.

It should also be mentioned that above-described method according to the present invention advantageously can be modified to perform timing recovery by maximizing the dispersion instead of minimizing it. Such a system would still be able to synchronize to the receiver clock but with a constant timing phase offset. In communication systems that incorporate an equalizer, such a constant timing phase offset can be corrected by an all-pass linear phase filter. All such modifications to this method are also considered to be within the scope of the present invention.

Finally, it should be mentioned that the methods described above in detail advantageously can be employed when the clock rate T is not precisely known, since the disclosed timing recovery methods are capable of tracking suitably small variations in frequency.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

What is claimed is:

1. A method for generating a timing offset signal applied to a sampling device for recovering a symbol stream, comprising:

generating a derivative signal approximating the derivative of the symbol stream;

producing a constant representative of an expected value of the symbol stream; and multiplying the derivative signal, the constant, and a signal corresponding to and approximating the symbol stream to thereby generate the timing offset signal.

2. The method as recited in claim 1, wherein:

the generated timing offset signal is a noisy timing offset signal;

the sampling device is responsive to a filtered timing offset signal; and the method further comprises:

filtering the noisy timing offset signal to thereby generate the filtered timing offset signal.

3. The method as recited in claim 1, wherein the derivative signal is based on the symbol stream upstream of the sampling device.

4. The method as recited in claim 1, further comprising:

combining the square of the signal corresponding to and approximating the symbol stream with a predetermined value representative of the expected value of the symbol stream to thereby generate the constant.

5. A method for recovering a symbol stream using a sampling device controlled by a timing offset signal by minimizing or maximizing the dispersion of received signal, comprising:

generating a derivative signal approximating the derivative of the symbol stream;

producing a constant representative of an expected value of the symbol stream;

multiplying the derivative signal, the constant, and a signal corresponding to and approximating the symbol stream to thereby generate a noisy timing offset signal;

filtering the noisy timing offset signal to thereby generate a filtered timing offset signal; and applying the filtered timing offset signal to the sampling device to thereby generate the symbol stream.

6. The method as recited in claim 5, wherein the derivative signal is based on the symbol stream upstream of the sampling device.

7. The method as recited in claim 5, further comprising:

combining the square of the signal corresponding to and approximating the symbol stream with a predetermined value representative of the expected symbol stream to thereby generate the constant.

8. A receiver for extracting a digital symbol stream from a filtered signal output by a receiver filter in response to a received broadcast signal by minimizing or maximizing the dispersion of received broadcast signal, comprising:

a sampling device which samples the filtered signal responsive to a control signal to thereby generate the digital symbol stream;

a differentiator which generates a derivative signal from a selected signal comprising the filtered signal and the digital symbol stream;

an arithmetic element which generates a constant representative of an expected value of the symbol stream;

a multiplier which generates a noisy timing offset signal responsive to the selected signal, the constant, and the derivative signal;

a noise limiting device which generates a timing offset signal responsive to the noisy timing offset signal; and a voltage controlled oscillator (VCO) which generates the control signal responsive to the timing offset signal.

9. The receiver as recited in claim 8, wherein the arithmetic element comprises a subtractor which subtracts the square of the selected signal from a predetermined value representative of the expected symbol stream.

10. The receiver as recited in claim 8, wherein the noise limiting device comprises a low pass filter.

11. The receiver as recited in claim 8, wherein:

the derivative signal comprises first and second derivative signals;

the receiver further comprises a derivative sampler which receives the first derivative signal from the differentiator and which generates the second derivative signal; and the derivative signal received by the multiplier comprises the second derivative signal.

12. The receiver as recited in claim 11, wherein the VCO generates a second control signal which controls the operation of the derivative sampler.

13. The receiver as recited in claim 8, wherein the constant is selected based on at least one characteristic of the received broadcast signal.

14. A receiver for extracting a digital symbol stream from a filtered signal output by a receiver filter in response to a received broadcast signal by minimizing or maximizing the dispersion of the received broadcast signal, comprising:
- a sampling device which operates at a predetermined frequency and which samples the filtered signal at the predetermined frequency to thereby generate a sampled symbol stream;
- a differentiator which generates a derivative value responsive to the sampled symbol stream;
- an arithmetic element which generates a constant representative of an expected value of the symbol stream;
- a multiplier which generates a noisy timing offset signal responsive to the sampled symbol stream, the constant, and the derivative value;
- a noise limiting device which generates a timing offset signal responsive to the noisy timing offset signal; and
- an interpolator responsive to the timing offset signal for interpolating the sampled symbol stream to thereby generate the digital symbol stream.

15. A receiver for extracting a digital symbol stream from a filtered signal output by a receiver filter in response to a received broadcast signal by minimizing or maximizing the dispersion of received broadcast signal, comprising:
- a sampling device which operates at a predetermined frequency and which samples the filtered signal at the predetermined frequency to thereby generate a sampled symbol stream;
- a differentiator which generates a derivative value responsive to the sampled symbol stream;
- an arithmetic element which generates a constant representative of an expected value of the symbol stream;
- a multiplier which generates a noisy timing offset signal responsive to the sampled symbol stream, the constant, and the derivative value;
- a noise limiting device which generates a timing offset signal responsive to the noisy timing offset signal; and
- a resampling circuit responsive to the timing offset signal for resampling the sampled symbol stream to thereby generate the digital symbol stream.

16. A digital signal processor comprising:
- means for generating a control signal suitable for controlling a sampler; and
- means for extracting a digital symbol stream from a received signal produced by filtering a broadcast signal, wherein said digital signal processor further comprising means responsive to a derivative of the signal, the signal, and a constant based on an expected value of the symbol stream, to minimize or maximize the dispersion of the received signal.

17. A receiver for extracting a digital symbol stream from a filtered signal output by a receiver filter in response to a received broadcast signal by minimizing or maximizing the dispersion of the received broadcast signal, comprising:
- a digital signal processor (DSP) which generates a control signal based on a derivative of the digital symbol stream, the digital symbol stream, and a constant based on an expected value of the digital symbol stream; and
- a sampler extracting the digital symbol stream from the filtered signal responsive to the control signal.

18. The receiver as recited in claim 17, wherein the DSP performs functions including:
- determining the derivative of the digital symbol stream;
- determining the constant based on an arithmetic combination of the square of the digital symbol stream and a predetermined value based on the expected value of the digital symbol stream.

19. A receiver for extracting a digital symbol stream from a filtered signal output by a receiver filter in response to a received broadcast signal, comprising:
- a digital signal processor (DSP) which generates a control signal characterizing the dispersion of the filtered signal based on a derivative symbol approximating the derivative of the symbol stream; and
- a sampler extracting the digital symbol stream from the filtered signal responsive to the control signal wherein said digital signal processor determines the derivative of the digital symbol stream and determines a constant based on an arithmetic combination of the square of the digital symbol stream and a predetermined value based on an expected value of the digital symbol stream.

* * * * *